(12) United States Patent
Ji et al.

(10) Patent No.: US 12,288,726 B2
(45) Date of Patent: Apr. 29, 2025

(54) ARRAY SUBSTRATE, DISPLAY PANEL AND MANUFACTURING METHOD THEREOF

(71) Applicants: Hefei Xinsheng Optoelectronics Technology Co., Ltd., Anhui (CN); BOE TECHNOLOGY GROUP CO., LTD., Beijing (CN)

(72) Inventors: Yu Ji, Beijing (CN); Guoping Qian, Beijing (CN); Lei Feng, Beijing (CN); Wanqing Chen, Beijing (CN); Lingling Zeng, Beijing (CN); Xianchun Huang, Beijing (CN); Chao Zhou, Beijing (CN); Youpeng Gan, Beijing (CN)

(73) Assignees: Hefei Xinsheng Optoelectronics Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 517 days.

(21) Appl. No.: 17/764,256

(22) PCT Filed: May 27, 2021

(86) PCT No.: PCT/CN2021/096237
§ 371 (c)(1),
(2) Date: Mar. 28, 2022

(87) PCT Pub. No.: WO2021/239033
PCT Pub. Date: Dec. 2, 2021

(65) Prior Publication Data
US 2022/0375803 A1    Nov. 24, 2022

(30) Foreign Application Priority Data
May 28, 2020 (CN) .......................... 202010468533.8

(51) Int. Cl.
*H01L 21/66* (2006.01)
*G02F 1/1343* (2006.01)
(Continued)

(52) U.S. Cl.
CPC .......... *H01L 22/30* (2013.01); *G02F 1/13439* (2013.01); *G02F 1/136254* (2021.01);
(Continued)

(58) Field of Classification Search
CPC ... H01L 27/1244; H01L 27/124; H01L 22/30; G02F 1/136254; G02F 1/13439; G02F 1/136259; G09G 3/006
See application file for complete search history.

(56) References Cited

U.S. PATENT DOCUMENTS

2004/0001176 A1  1/2004 Kim
2014/0111099 A1* 4/2014 Liu ...................... G09G 3/3659
257/59

(Continued)

FOREIGN PATENT DOCUMENTS

CN   101614916 A   12/2009
CN   102023424 A   4/2011
(Continued)

OTHER PUBLICATIONS

China Patent Office, First Office Action issued Mar. 28, 2022 for application No. CN202010468533.8.
(Continued)

*Primary Examiner* — Joseph C. Nicely
(74) *Attorney, Agent, or Firm* — HOUTTEMAN LAW LLC (57) ABSTRACT

An array substrate, a display panel and methods of manufacturing the same are provided. The method of manufacturing an array substrate according to an embodiment of the present disclosure includes: forming f pixel electrodes and a
(Continued)

conductive structure on a substrate through a patterning process, wherein the pixel electrodes arranged in a first direction are connected through the conductive structure; and forming a signal line on the substrate through a patterning process, wherein the signal line and the pixel electrodes are disposed in the same layer. By means of the array substrate according to the embodiments of the present disclosure, the problem that it is not easy to discover the point defects caused by short circuit between the signal line and pixel electrodes in the related art can be solved.

12 Claims, 4 Drawing Sheets

(51) Int. Cl.
    *G02F 1/1362*     (2006.01)
    *G09G 3/00*     (2006.01)
    *H10D 86/01*     (2025.01)
    *H10D 86/40*     (2025.01)
    *H10D 86/60*     (2025.01)

(52) U.S. Cl.
    CPC ........... *G09G 3/006* (2013.01); *H10D 86/021* (2025.01); *H10D 86/441* (2025.01); *H10D 86/443* (2025.01); *H10D 86/60* (2025.01); *G02F 1/134363* (2013.01); *G02F 1/136259* (2013.01); *H01L 22/20* (2013.01)

(56) References Cited

U.S. PATENT DOCUMENTS

| | | | | |
|---|---|---|---|---|
| 2014/0124800 | A1* | 5/2014 | Um | G02F 1/134363 |
| | | | | 257/88 |
| 2015/0372016 | A1* | 12/2015 | Cheng | H01L 27/124 |
| | | | | 257/72 |
| 2016/0027817 | A1* | 1/2016 | Yoo | H10K 59/123 |
| | | | | 438/151 |
| 2016/0276377 | A1* | 9/2016 | Sun | H01L 29/78669 |
| 2019/0227400 | A1 | 7/2019 | Lee et al. | |
| 2021/0366946 | A1* | 11/2021 | Jia | H01L 27/1244 |
| 2024/0292694 | A1* | 8/2024 | Zeng | H10K 59/131 |

FOREIGN PATENT DOCUMENTS

| | | |
|---|---|---|
| CN | 102637636 A | 8/2012 |
| CN | 102655155 A | 9/2012 |
| CN | 102709241 A | 10/2012 |
| CN | 102723311 A | 10/2012 |
| CN | 102959604 A | 3/2013 |
| CN | 103018977 A | 4/2013 |
| CN | 104617115 A | 5/2015 |
| CN | 105655295 A | 6/2016 |
| CN | 109426014 A | 3/2019 |
| TW | 594337 B | 6/2004 |
| WO | 2013086919 A1 | 6/2013 |

OTHER PUBLICATIONS

China Patent Office, Decision of rejection issued Sep. 15, 2022 for application No. CN202010468533.8.

* cited by examiner

ARRAY SUBSTRATE, DISPLAY PANEL AND MANUFACTURING METHOD THEREOF

CROSS REFERENCE TO RELATED APPLICATION

This application is a National Phase Application filed under 35 U.S.C. 371 as a national stage of PCT/CN2021/096237, filed on May 27, 2021 an application claiming the priority of the Chinese patent application No. 202010468533.8, filed on May 28, 2020, the contents of which are incorporated herein by reference in their entirety.

TECHNICAL FIELD

The embodiments of the present disclosure relate to the technical field of display, and in particular, to an array substrate, a display panel and a manufacturing method thereof.

BACKGROUND

Liquid crystal display panels are important components in the display field. Display technologies of the liquid crystal display panel may be classified into TN mode, IPS mode, and VA mode according to display principles. Advanced-Super Dimensional Switching technology (ADS technology) gradually derives from the IPS technologies. In recent years, High Aperturen Advanced Super Dimensional Switching (HADS) products have gained popularity because of high aperture ratio and wide viewing angle.

Figure 1:
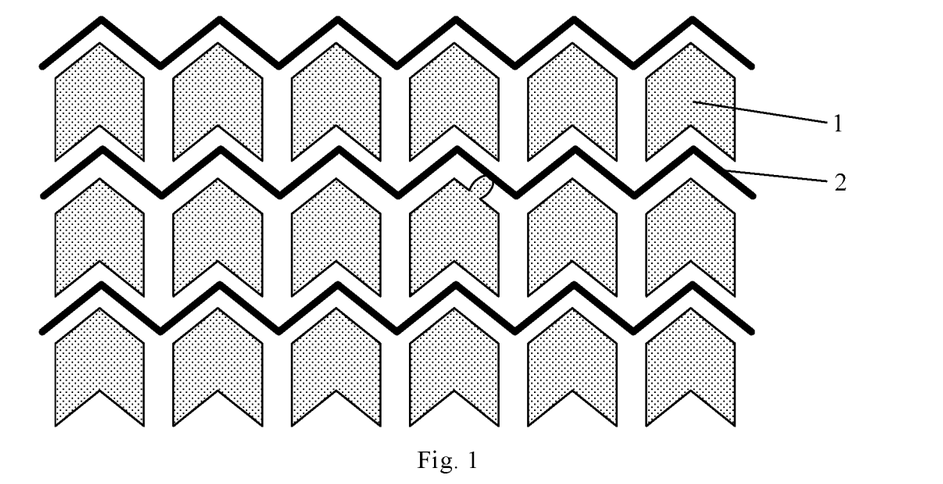
FIG. 1 is a schematic view of an array substrate formed according to a method of manufacturing an array substrate in the related art.

In the related art, as shown in FIG. 1, the pixel electrodes and the gate lines of the HADS display product are disposed in the same layer without an insulating structure therebetween. In the manufacturing process, short circuit between the pixel electrodes and the gate lines may occur due to material residue, which would result in a phenomenon of pixel point defect. What's more, when performing detection, it is not easy to detect a single pixel point defect. Even if a single pixel point defect is detected in the subsequent Array Test (AT) detection, other bad display phenomena may be caused during the maintenance due to a plurality of other layer structures arranged above the pixel electrodes and the gate lines.

SUMMARY

The present disclosure is intended to solve at least one of the technical problems in the existing art, and provides a method of manufacturing an array substrate, which can improve the product yield rate of the array substrate.

According to a first aspect, an embodiment of the present disclosure provides a method of manufacturing an array substrate, including:

forming a plurality of pixel electrodes and a conductive structure on a substrate through a patterning process, wherein the plurality of pixel electrodes arranged in a first direction are connected through the conductive structure; and forming a signal line on a substrate through a patterning process, wherein the signal line and the pixel electrodes are disposed in the same layer.

In an optional embodiment, the conductive structure and the pixel electrodes are disposed in the same layer and made of a same material.

In an optional embodiment, the first direction is the same as an extending direction of the signal line.

In an optional embodiment, the plurality of pixel electrodes are arranged in an array; the pixel electrodes in the same row are connected through the conductive structure; and the signal line extends in a row direction of the array.

In an optional embodiment, the method of manufacturing the array substrate further includes: performing a short circuit detection of the signal line on the array substrate.

Further, in an optional embodiment, after performing the short circuit detection on the array substrate, the method further includes:

removing the conductive structure through an etching process, so as to insulate and disconnect different pixel electrodes.

Further, in an optional embodiment, after performing the short circuit detection on the array substrate, the method further includes:

forming an insulating layer on the substrate;
etching the insulating layer to expose the conductive structure;
forming a common electrode layer on the substrate; and
etching the substrate formed with the common electrode layer to form a common electrode, and removing the conductive structure.

In an optional embodiment, after removing the conductive structure, an insulating material is formed at a position corresponding to the conductive structure, so as to insulate between the adjacent pixel electrodes.

According to a second aspect, an embodiment of the present disclosure provides a method of manufacturing a display panel, the method including manufacturing an array substrate by any one of the methods of manufacturing an array substrate as described above.

According to a third aspect, an embodiment of the present disclosure provides an array substrate including: a substrate, a plurality of pixel electrodes and a signal line disposed on the substrate, wherein the pixel electrodes and the signal line are disposed in the same layer; a through-hole is disposed between the adjacent pixel electrodes arranged in a first direction in a layer of the pixel electrodes; and the through-hole spaces the adjacent pixel electrodes and the through-hole is filled with an insulating material.

According to a fourth aspect, an embodiment of the present disclosure provides a display panel, including an array substrate manufactured by any one of the methods of manufacturing the array substrate as described above.

In the method of manufacturing an array substrate according to the embodiments of the present disclosure, a conductive structure are formed at the same time of forming the pixel electrodes, and a plurality of pixel electrodes are connected into a whole through the conductive structure. Therefore, in the manufacturing process of the array substrate, if short circuit occurs between the signal line and a certain pixel electrode due to material residue, the point defect phenomenon originally caused by short circuit between a single pixel electrode and the signal line would become a line defect phenomenon during a Gate OS test. Therefore, the point defect phenomenon of the short circuit of the array substrate can be amplified, so that a point defect of the array substrate caused by short circuit between the pixel electrode and the signal line can be detected at the Gate OS test stage, thereby achieving fast signal line short circuit defection on the array substrate, and increasing the manufacturing efficiency and the product yield rate of the array substrate.

DETAIL DESCRIPTION OF EMBODIMENTS

To make those skilled in the technology better understand the technical solutions of the present disclosure, the present disclosure will be further described in detail in conjunction with the accompany drawings and embodiments.

Embodiment 1

Figure 2:
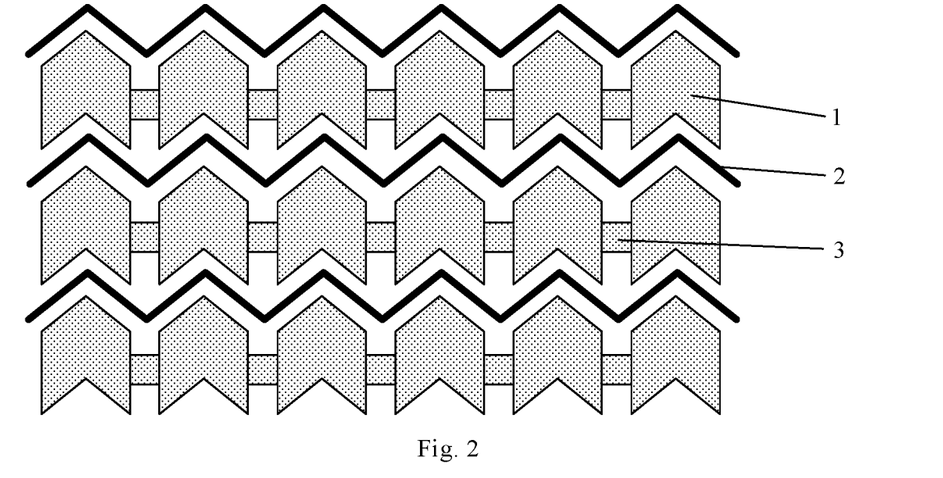
FIGS. 2 and 3 are schematic views of an array substrate during detection of the array substrate in a method of manufacturing an array substrate according to an embodiment of the present disclosure.
Figure 3:
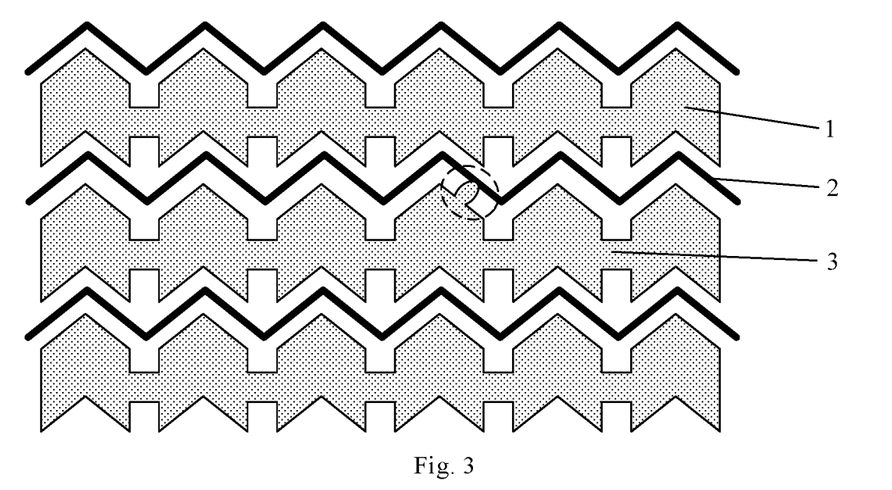

As shown in FIGS. 2 to 6, in this embodiment there is provided a method for manufacturing an array substrate, which is suitable for manufacturing an array substrate, and in particular for an array substrate of an HADS display product. The array substrate manufactured by the manufacturing method according to this embodiment can quickly find a short circuit problem between a pixel electrode 1 and a signal line 2 in an array substrate. Specifically, the method according to this embodiment can include the following step:

Step S11, forming a plurality of pixel electrodes 1 and a conductive structure 3 on a substrate through a patterning process, the plurality of pixel electrodes 1 arranged in a first direction being connected through the conductive structure 3.

In one example, the material of the pixel electrode 1 includes indium tin oxide (ITO).

Specifically, in this step, a conductive material layer is formed on the substrate through a deposition process, and a patterned layer of pixel electrodes 1, i.e., a plurality of pixel electrodes 1, is formed through a patterning process such as photolithography and etching. The pixel electrodes 1 have a regular arrangement, such as an array arrangement, or a circular arrangement.

As shown in FIG. 1, in an array substrate according to the related art, the signal lines 2 and the pixel electrodes 1 are generally disposed in the same layer with only a simple physical separation therebetween but without an insulating structure. Due to the influence of some factors such as practical manufacturing process, the material residuals may exist during the manufacturing process of the signal lines 2 and the pixel electrodes 1. Such material residuals may cause possible short circuit between the pixel electrodes 1 and the signal lines 2, which would result in a point defect phenomenon. In the related art, a Gate open-short (OS) test step is performed after the signal line 2 is manufactured. However, since the pixel electrode 1 is a single independent conductive pattern, it is not easy to find the point defect phenomenon caused by short circuit between the pixel electrodes 1 and the signal lines 2 during the Gate OS detection. Such a point defect display phenomenon can only be detected in the subsequent AT (array test) detection. That is, the point defect is detected after various other layers of structures on the array substrate are manufactured. However, since there is already a plurality of other layers of structures above the layer of the pixel electrodes 1 and the signal lines 2, other display defects would be easily caused during the maintenance.

As shown in FIGS. 2 and 3, the pixel electrodes 1 in an array substrate are generally in a regular arrangement. According to a manufacturing method of this embodiment, a conductive structure 3 can also be formed at the same time of forming the pixel electrodes 1, and the pixel electrodes 1 are connected into a whole through the conductive structure 3. Specifically, the pixel electrodes 1 arranged in a first direction are electrically connected through the conductive structure 3. In such way, as shown in FIG. 3, if short circuit occurs between the signal line 2 and a certain pixel electrode 1 due to material residuals (the material residuals of the signal line or (the material residuals of the pixel electrode) during the manufacturing process of the array substrate, since the pixel electrodes 1 are connected through the conductive structure 3 in this embodiment, the point defect phenomenon originally caused by short circuit between the single pixel electrode 1 and the signal line 2 would become a line defect phenomenon during a Gate OS test. Therefore, the point defect phenomenon of the short circuit of the array substrate can be amplified to facilitate detection of a point defect phenomenon of the array substrate caused by short circuit between the pixel electrode 1 and the signal line 2.

In one example, the first direction can be a row direction or a column direction of an array, or a circumferential direction for a circular arrangement.

Preferably, in this embodiment, the conductive structure 3 and the pixel electrodes 1 are disposed in the same layer and made of the same material. That is, in order to simplify the manufacturing process of the array substrate, the conductive structure 3 and the pixel electrodes 1 can be formed by a single patterning process. Further, as shown in FIG. 3, since the conductive structure 3 is configured to connect the pixel electrodes 1, the pixel electrodes 1 and the conductive structure 3 can be directly designed into an integral structure. Of course, it should be understood that the conductive structure 3 can also be separately manufactured from the pixel electrodes 1, which is not particularly limited in this embodiment.

It should be noted that, in this embodiment, the conductive structure 3 is only intended to connect the pixel electrodes 1 at the manufacturing stage of the array substrate, and the pixel electrodes 1 need to be disconnected in the subsequent process. In order to facilitate etching of the conductive structure 3 in the subsequent steps, the size of the conductive structure 3 is preferably not too large in this embodiment as long as the pixel electrodes 1 can be connected.

Preferably, the pixel electrodes 1 are arranged in an array; and the pixel electrodes 1 in the same row are connected though the conductive structure 3. As shown in FIG. 2, in an array substrate, the independent pixel electrodes 1 are arranged in array. In this embodiment, it is preferable that pixel electrodes 1 in the same row are connected through a conductive structure 3, so that a point defect phenomenon caused by short circuit between a single pixel electrode 1 and the signal line 2 is converted into a line defect phenomenon caused by short circuit between a row of pixel electrodes 1 and the signal line 2.

The manufacturing method according to this embodiment further includes:

Step S12, forming a signal line 2 on the substrate through a patterning process, the signal line 2 and the pixel electrodes 1 being disposed in the same layer.

In an example, the signal line 2 includes a Gate line. Preferably, the materials of the signal line 2 include conductive metal with good conductivity, such as copper and silver. Specifically, in this step, a conductive material layer is formed on the substrate through deposition, sputtering, and the like, and then a desired pattern of the signal line 2 is formed through an etching process. It should be noted that, according to practical application circumstances of the array substrate, the signal line can also be other signal lines, such as a touch line, which is not particularly limited in this embodiment.

Preferably, in this embodiment, the first direction is the same as an extending direction of the signal line 2. Specifically, when the pixel electrodes 1 are arranged in an array, the extending direction of the signal line 2 may be a row direction or a column direction of the array of pixel electrodes 1. As shown in FIG. 2, a plurality of signal lines 2 extend in the row direction of the array of pixel electrodes 1 and meanwhile are arranged in the column direction of the array of pixel electrodes 1. At this time, the pixel electrodes 1 in the same row are preferably connected through the conductive structure 3. Therefore, when the signal line 2 and the pixel electrode 1 are in short circuit, an approximate range of the position of the pixel electrode 1 that is short circuited can be conveniently and quickly identified, which facilitates fast detection of a bad point.

In the related art, especially for HADS display products, the gate line and the pixel electrodes 1 are disposed in the same layer without an insulating structure therebetween, and connection of the gate line and the pixel electrodes 1 is prevented by spatial separation. It should be noted that, in this embodiment, that the pixel electrodes 1 and the signal line 2 are disposed in the same layer means that the pixel electrodes 1 and the signal line 2 are in the same layer of the substrate in the physical sense (or in the spatial sense), and does not mean that the pixel electrodes 1 and the signal line 2 are manufactured by a single patterning process in the manufacturing process.

It should be understood that, in this embodiment, the pixel electrodes 1 and the signal lined 2 are manufactured independently and separately, and since the pixel electrodes 1 and the signal lines 2 are disposed in the same layer, there is no need to limit the sequence of the manufacturing processes of the pixel electrodes 1 and the signal lines 2. Therefore, in an embodiment of the present disclosure, step S11 can be performed before step S12, or step S12 can be performed before step S11.

During the manufacturing process of the array substrate, the signal line 2 and the pixel electrodes 1 may be short-circuited due to uncontrollable factors. Based on the method for manufacturing an array substrate according to this embodiment, the array substrate can be detected at the Gate OS stage, and whether the array substrate has short circuit between the signal line 2 and the pixel electrode 1 can be quickly determined through the discovered line defect phenomenon. Therefore, fast detection of signal line short circuit for the array substrate can be achieved, and the manufacturing efficiency and the product yield rate of the array substrate are improved.

Preferably, the method of manufacturing an array substrate according to this embodiment further includes: a step S21, performing the short circuit detection of the signal line 2 on the array substrate.

In this step, whether the signal line 2 and the pixel electrode 1 are short circuited can be detected by performing signal line short circuit detection for each signal line 2 on the array substrate. Specifically, in this step, when performing signal line short circuit detection on the array substrate, a test signal is input to one end of the signal line 2 and received at the other end of the signal line 2. Under normal conditions, after the test signal is transmitted through a single signal line 2, the signal intensity, amplitude and the like of the test signal do not change greatly. As shown in FIG. 2, in the manufacturing method according to this embodiment, at the time of performing signal line short circuit detection, the pixel electrodes 1 are in a state of being connected through the conductive structure 3. If the signal line 2 is short-circuited with a certain pixel electrode 1, it is equivalent to being short-circuited with the plurality of pixel electrodes 1 at the same time and the transmission resistance of the signal line 2 becomes large, which may result in large attenuation of the test signal in the transmission process. That is to say, compared with a normal signal line 2 that is not short-circuited with a pixel electrode 1, the detection signal output by the signal line 2 that is short-circuited is more obviously abnormal, so that the signal line 2 short circuit phenomenon of the array substrate can be detected according to the intensity of the test signal received and detected at the receiving end.

It should be understood that after the short circuit detection of the signal line 2 is performed on the array substrate, the array substrate can be repaired according to the detection structure or be further manufactured in the subsequent step. In an optional embodiment, after the short circuit detection of the signal line 2 is performed on the array substrate, the method of manufacturing an array substrate according to this embodiment can further include a step of repairing the defect. Specifically, in this embodiment, the conductive material at the short-circuit position between the signal line 2 and the pixel electrode 1 is removed by an etching process, so that the pixel electrode 1 and the signal line 2 are disconnected. In this embodiment, short circuit defect between the signal line 2 and the pixel electrode 1 can be detected at the Gate OS detection stage. When repairing an array substrate having the defects, less layer structures penetrated by the through-hole can effectively avoid other defects caused in the repair process.

Figure 4:
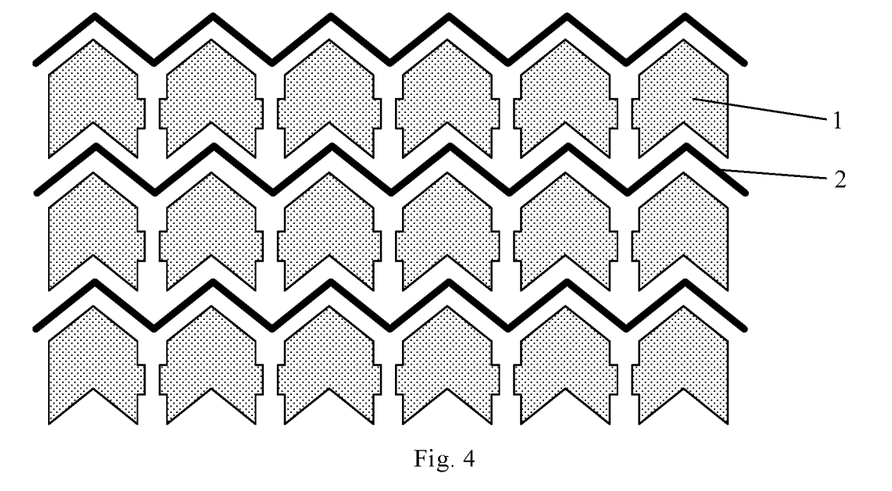
FIG. 4 is a schematic view of an array substrate formed by the method of manufacturing the array substrate according to the embodiment of the present disclosure.

Meanwhile, as shown in FIG. 2, when performing the signal line 2 short-circuit detection, the pixel electrodes 1 on the array substrate are in a state of being connected through the conductive structure 3. It should be understood that, as shown in FIG. 4, after the detection is finished, the pixel electrodes 1 need to be disconnected to ensure normal use of the array substrate. In this embodiment, the conductive structure 3 is etched and removed by an etching process, so that the connected pixel electrodes 1 are disconnected.

Figure 5:
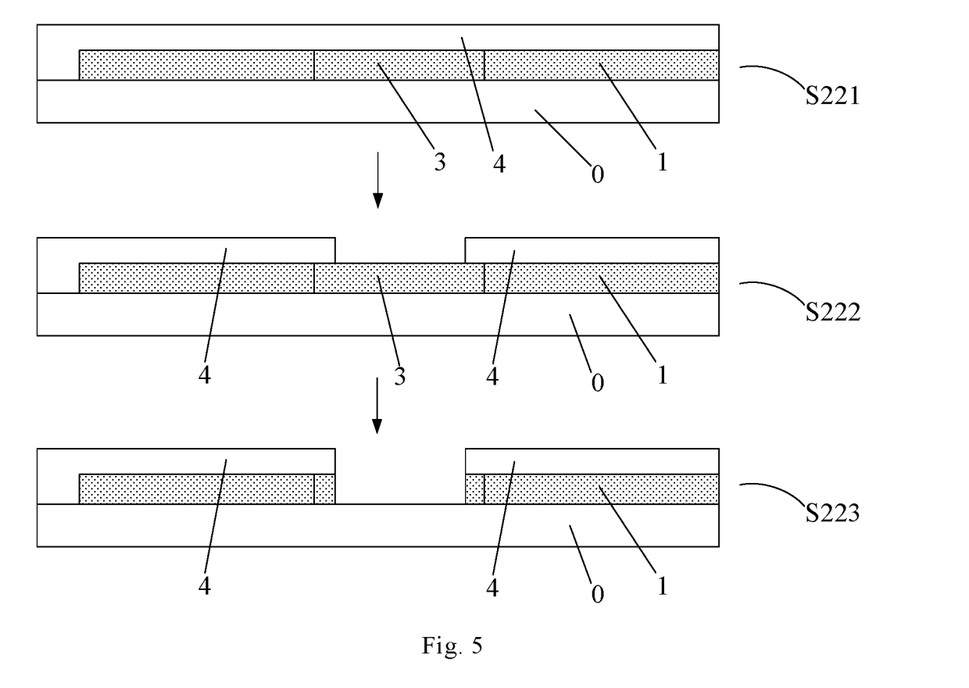
FIG. 5 is a schematic view illustrating a step of removing a conductive structure in the method of manufacturing the array substrate according to the embodiment of the present disclosure.

In an optional embodiment, as shown in FIG. 5, the pixel electrodes 1 are disconnected by the following steps of S221, S222 and 223.

In Step S221, forming an etching barrier layer 4 on the substrate.

In Step S222, forming a through-hole on the etching barrier layer 4 through an etching process, so as to expose the conductive structure 3.

In this step, the material of the insulating layer 4 corresponding to the position of the conductive structure 3 is removed by a process such as photolithography to form a through-hole, so as to expose the conductive structure 3. The shape, size and number of the through-hole are not limited, as long as the conductive structure 3 can be exposed and the pixel electrodes 1 connected by the conductive structure 3 can be disconnected after the exposed conductive structure 3 is removed.

In Step S223, removing the conductive structure 3 corresponding to the position of the through-hole through an etching process, so as to insulate and disconnect different pixel electrodes 1.

In this step, the conductive structure 3 exposed at the through-hole is removed by wet etching or the like, so as to disconnect the pixel electrodes 1 that are previously connected through the conductive structure 3.

It should be understood that, in this embodiment, the array substrate should include not only the pixel electrodes 1 and the signal line 2, but also a thin film transistor 5, a common electrode 6, and the like. In one example, the thin film transistor 5 can be formed after the pixel electrodes 1 are disconnected. In one example, the thin film transistor 5, the common electrode 6, and the like can be formed on the substrate after the etching barrier layer 4 is removed.

Figure 6:
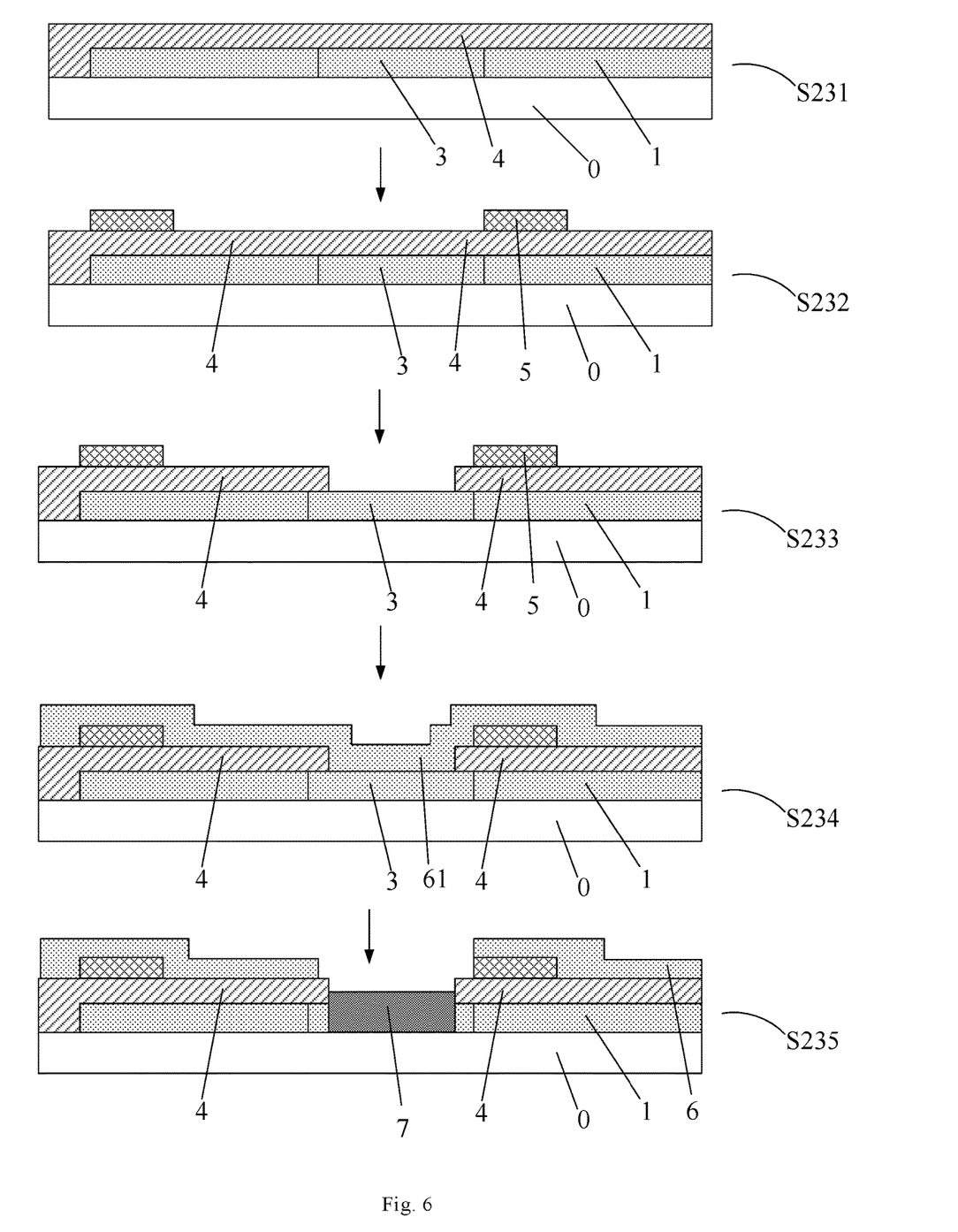
FIG. 6 is a schematic view illustrating another step of removing the conductive structure in the method of manufacturing the array substrate according to the embodiment of the present disclosure.

As a preferred embodiment, as shown in FIG. 6, in this embodiment, the material of the common electrode 6 can be the same as that of the conductive structure 3, and the conductive structure 3 can be removed at the same time of forming the common electrode 6. Specifically, the method of manufacturing an array substrate of this embodiment includes steps of S231, S232, S233, S234, and S235.

In step S231, forming an insulating layer 4 on a substrate formed with a signal line 2.

In this embodiment, the signal line 2, the pixel electrodes 1, and the like may be separated by the structure of the insulating layer 4. In this step, the insulating layer 4 may be formed on a substrate formed with a signal line 2, so as to facilitate the subsequent manufacturing of other device structures on the substrate, and meanwhile, the insulating layer 4 may serve as an etching barrier layer 4 during the subsequent etching of the conductive structure 3.

In step S232, forming structures such as a thin film transistor 5 and a data line on the insulating layer 4.

In step S233, etching the insulating layer 4 to form a through-hole, so as to expose the conductive structure 3.

In one example, the structures such as the thin film transistor 5 and the data line (not shown) preferably do not overlap with an orthographic projection of the conductive structure 3 on the substrate, so as to facilitate removal of the conductive structure 3. It should be understood that the respective structures of the thin film transistor 5, the data line, and the like are patterned. In this embodiment, when there is no overlap with the orthographic projection of the conductive structure 3 on the substrate, the sequence of the steps S23 and S24 cannot be limited, as long as a portion of the insulating layer 4 is etched to expose the conductive structure 3 before the common electrode layer is formed.

In step S234, forming a common electrode layer 61 on the substrate.

Preferably, in this embodiment, the material of the common electrode 6 is the same as the material of the conductive structure 3. A specific material of the common electrode 6 may include ITO.

And in step S235, etching the common electrode layer 61 and the conductive structure 3 at the position of the through-hole by a single etching process to form a common electrode 6, and removing the exposed conductive structure 3.

In this embodiment, by making the common electrode 6 and the conductive structure 3 from the same material, the conductive structure 3 connecting the pixel electrodes 1 can be removed by the single etching process when forming a pattern of the common electrode 6, thereby simplifying the manufacturing process of the array substrate.

It should be understood that the specific processes for forming the structures such as the thin film transistor 5 and the common electrode 6 as well as the etching process are well-developed technologies in this technical field. Reference can be made to relevant materials for specific details, which will not be described in this embodiment.

Preferably, the manufacturing method according to this embodiment may further include: after removing the conductive structure 3, forming an insulating material 7 at a position corresponding to the through-hole. That is to say, after removing the conductive structure 3, the insulating material 7 is formed at a position where the conductive structure 3 was originally disposed, so as to ensure an insulating state between the pixel electrodes 1, and avoid short circuit between the pixel electrodes 1 caused by other materials falling into the through-hole in the subsequent process.

Embodiment 2

This embodiment provides a method of manufacturing a display panel, including: manufacturing an array substrate by any one of the methods for manufacturing an array substrate according to Embodiment 1.

Since the method of manufacturing a display panel according to this embodiment includes manufacturing an array substrate by the method of manufacturing an array substrate according to Embodiment 1, in the manufacturing process of the display panel, whether the array substrate has short circuit between the signal line and the pixel electrode can be quickly determined by the discovered line defect phenomenon, so that fast detection of the array substrate is realized, and the manufacturing efficiency and product yield rate of the display panel are improved.

Embodiment 3

This embodiment provides an array substrate, including: a substrate, a plurality of pixel electrodes 1 and a signal line 2 disposed on the substrate, the pixel electrodes 1 and the signal line 2 being disposed in the same layer, a through-hole is disposed between the plurality of pixel electrodes 1 arranged in a first direction in a layer of the pixel electrodes 1, and an insulating material 7 is filled in the through-hole to separate adjacent pixel electrodes 1.

The array substrate according to this embodiment can be manufactured by any one of the methods according to Embodiment 1. Therefore, the number of layers through which the through-hole penetrates is reduced, other undesirable phenomena caused by undesirable repair of the signal line 2 and the pixel electrodes 1 are reduced, and the product yield rate is improved.

It should be understood that above embodiments are just examples for illustrating the principle of the invention, however, the invention is not limited thereto. Various modifications and variations can be made by a person skilled in the technology without departing from the spirit and the scope of the present invention. These modifications and variations should be considered to be within protection scope of the present invention.

What is claimed is:

1. A method of manufacturing an array substrate, comprising:
 forming pixel electrodes and a conductive structure on a substrate through a patterning process, wherein the pixel electrodes arranged in a first direction are connected through the conductive structure; and forming a signal line on the substrate through a patterning process, wherein the signal line and the pixel electrodes are disposed in the same layer;

forming an insulating layer on the substrate formed with the signal line;

performing a short circuit detection of the signal line on the array substrate;

removing the conductive structure through an etching process, so as to insulate and disconnect different pixel electrodes; and after removing the conductive structure, filling an insulating material at a position corresponding to the conductive structure so as to insulate between the adjacent pixel electrodes, wherein a surface of the insulating material opposite to the substrate is positioned at a level between a surface of the insulating layer opposite to the substrate and a surface of each of the pixel electrodes opposite to the substrate.

2. The method of claim 1, wherein the conductive structure and the pixel electrodes are disposed in the same layer and made of a same material.

3. The method of claim 1, wherein the first direction is the same as an extending direction of the signal line.

4. The method of claim 1, wherein the pixel electrodes are arranged in an array;

the pixel electrodes in the same row are connected through the conductive structure; and the signal line extends in a row direction of the array.

5. The method of claim 1, wherein after performing the short circuit detection on the array substrate, the method further comprises:

etching the insulating layer to expose the conductive structure;

forming a common electrode layer on the substrate; and etching the substrate formed with the common electrode layer to form a common electrode at the same time of removing the conductive structure.

6. A method of manufacturing a display panel, comprising: manufacturing an array substrate by the method of manufacturing an array substrate according to claim 1.

7. The method of claim 6, wherein the conductive structure and the pixel electrodes are disposed in the same layer and made of a same material.

8. The method of claim 6, wherein the first direction is the same as an extending direction of the signal line.

9. The method of claim 6, wherein the pixel electrodes are arranged in an array;

the pixel electrodes in the same row are connected through the conductive structure; and the signal line extends in a row direction of the array.

10. The method of claim 6, wherein after performing the short circuit detection on the array substrate, the method further comprises:

etching the insulating layer to expose the conductive structure;

forming a common electrode layer on the substrate; and etching the substrate formed with the common electrode layer to form a common electrode at the same time of removing the conductive structure.

11. A display panel, comprising the array substrate manufactured by the method of manufacturing an array substrate according to claim 1.

12. An array substrate, comprising: a substrate, pixel electrodes and a signal line disposed on the substrate, wherein the pixel electrodes and the signal line are disposed in the same layer;

an insulating layer is formed on the substrate formed with the pixel electrodes and the signal line;

a through-hole is disposed between the adjacent pixel electrodes arranged in a first direction in a layer of the pixel electrodes; and the through-hole spaces between the adjacent pixel electrodes, and the through-hole is filled with an insulating material, wherein a surface of the insulating material opposite to the substrate is positioned at a level between a surface of the insulating layer opposite to the substrate and a surface of each of the pixel electrodes opposite to the substrate.

* * * * *